(12) United States Patent
Son et al.

(10) Patent No.: US 8,351,256 B2
(45) Date of Patent: Jan. 8, 2013

(54) NONVOLATILE MEMORY DEVICE OUTPUTTING ANALOG SIGNAL AND MEMORY SYSTEM HAVING THE SAME

(75) Inventors: Hong Rak Son, Anyang-si (KR); Jaehong Kim, Seoul (KR); Junjin Kong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 228 days.

(21) Appl. No.: 12/821,654

(22) Filed: Jun. 23, 2010

(65) Prior Publication Data

US 2011/0032758 A1 Feb. 10, 2011

(30) Foreign Application Priority Data

Aug. 7, 2009 (KR) .................. 10-2009-0072917

(51) Int. Cl.
*G11C 11/34* (2006.01)

(52) U.S. Cl. .............................. 365/185.03; 365/185.24

(58) Field of Classification Search ............. 365/185.03, 365/185.24
See application file for complete search history.

(56) References Cited

U.S. PATENT DOCUMENTS

| | | | |
|---|---|---|---|
| 6,147,630 A | 11/2000 | Sasai et al. | |
| 6,317,361 B2 | 11/2001 | Yoshida et al. | |
| 7,675,440 B1 * | 3/2010 | Xiao et al. | ................. 341/118 |

FOREIGN PATENT DOCUMENTS

| | | |
|---|---|---|
| JP | 11-341347 | 12/1999 |
| JP | 2001-202789 | 7/2001 |
| KR | 10-1998-0022520 | 7/1998 |

* cited by examiner

*Primary Examiner* — Michael Tran
(74) *Attorney, Agent, or Firm* — Harness, Dickey & Pierce, P.L.C.

(57) ABSTRACT

A memory system and a nonvolatile memory device therein are disclosed. The memory system comprises a memory device outputting a plurality of analog signals during a read operation, a converter to convert the plurality of analog signals into binary data, and a memory controller to operate an error correction operation on the binary data. The error correction operation uses a soft decision algorithm.

15 Claims, 8 Drawing Sheets

NONVOLATILE MEMORY DEVICE OUTPUTTING ANALOG SIGNAL AND MEMORY SYSTEM HAVING THE SAME

CROSS-REFERENCE TO RELATED APPLICATION

This non-provisional application claims priority under 35 U.S.C. §119 to Korean Patent Application No. 10-2009-0072917, filed Aug. 7, 2009, in the Korean Intellectual property Office (KIPO), the entire contents of which are incorporated herein by reference.

BACKGROUND

1. Field

Example embodiments relate to a semiconductor memory device, and more particularly to a nonvolatile memory device outputting analog signal and a memory system having the same.

2. Description of Related Art

Semiconductor memory devices are generally the most inevitable micro electronic parts for digital logic devices, such as a computer and an application based on a microprocessor ranging from a satellite to a consumer electronic product. Therefore, improving manufacturing technology of semiconductor memory devices including process and technique development that is acquired through scale-down for high integration and high speed has helped to establish performance criteria of other digital logic devices.

Semiconductor memory devices are largely divided into volatile semiconductor memory devices and nonvolatile semiconductor memory devices. In volatile memory devices, logic information is stored by setting logic state of bi-stable flip-flop in case of SRAM and by charging a capacitor in case of DRAM. Also volatile memory devices can store and read data only while power is supplied but lose data when power is removed. On the other hand, nonvolatile memory devices including MROM, PROM, EPROM, EEPROM, etc can store data even when power is removed. Data state in nonvolatile memory devices can be stored permanently or reprogrammed according to manufacturing process. Reprogrammable nonvolatile semiconductor memory devices have been used to store data and program code in wide range of applications including computer, avionics, telecommunication, and consumer electronic technique industry.

Flash memory is one of example of reprogrammable nonvolatile semiconductor memory devices. As a result of a recent demand for high density of semiconductor memory devices is, multi-bit memory devices that can store multi-bit per memory cell have been developed. In order to store multi-bit in a memory cell of multi-bit flash memory, more threshold voltages distinguishable each other should be included within a limited voltage window. Due to this requirement, an error during read operation caused by variation of threshold voltages can often occur in the multi-bit flash memory. There are various causes of the variation of threshold voltage of multi-bit memory cell. For instance, because of charge leakage of floating gate, program disturbance stress, and read disturbance stress, threshold voltage of the multi-bit memory cell may be increased or decreased by each data state. Accordingly, in multi-bit memory device to store more and more data in per memory cell, a technique for solving the error during read operation has been requested.

SUMMARY

According to an example embodiment, a memory system comprises a memory device including a plurality of memory cells, the memory device being configured to output a plurality of analog signals from selected memory cells of a plurality of memory cells during a read operation, a converter configured to convert the plurality of analog signals into binary data, and a memory controller configured to operate an error correction operation on the digital data. The memory controller is configured to supply an analog read command to the memory device, which indicates the read operation.

According to an example embodiment, each voltage level of the plurality of analog signals depends on a threshold voltage of each of the selected memory cells. The converter is configured to receive a reference signal and to convert the plurality of analog signals into the binary data based on the reference signal, and the reference signal determines a resolution of the binary data. Also, the converter is included in at least one of the memory device and the memory controller.

According to an example embodiment, the error correction operation is a soft decision operation executed on the binary data.

According to an example embodiment, the memory device comprises a memory cell array including a plurality of nonvolatile memory cells, a page buffer configured to sense and latch data of the plurality of nonvolatile memory cells through a plurality of bit lines, an analog output circuit configured to output the plurality of analog signals that are detected from the plurality of bit lines during the read operation, a switch configured to selectively connect the plurality of bit lines to the page buffer or the analog output circuit and a control logic configured to control the switch to output the plurality of analog signals, in response to a command from the memory controller.

The analog output circuit includes an analog amplifier configured to amplify the plurality of analog signals and an analog output buffer to output the amplified plurality of analog signals.

The analog output circuit is further configured to output the plurality of analog signals without discrete processing.

According to another example embodiment, a nonvolatile memory device comprises a memory cell array including a plurality of memory cells, an analog output circuit configured to output the plurality of analog signals detected on a bit lines associated with a selected memory cells of the plurality of memory cells during a read operation, a voltage generator configured to generate an analog read voltage for the read operation, and a control logic configured to control the voltage generator to supply the analog read voltage to the selected memory cells and configured to control the analog output circuit to output the plurality of analog signals to a externally, in response to a command.

In another aspect, the nonvolatile memory device further includes a converter configured to convert the plurality of analog signals to binary data. The analog output circuit is configured to output the plurality of analog signals to the converter and the converter is configured to outputs the binary data externally.

The analog output circuit is further configured to output the plurality of analog signals without discrete processing.

According to another example embodiment, a nonvolatile memory device comprises a memory cell array including a plurality of memory cells; a voltage generator configured to generate an analog read voltage; an analog output circuit configured to output a plurality of analog signals detected on bit lines coupled to selected memory cells from among the plurality of memory cells during a read operation, each of the plurality of analog signals being based on the analog read voltage and a threshold voltage of each corresponding memory cell of the selected memory cells; and a converter configured to convert the plurality of analog signals to binary data by performing a comparison based on each of the plurality of analog signals and the analog read voltage.

According to an example embodiment, the converter is configured to convert the plurality of analog signals to binary data based on a difference between each of the plurality of analog signals and the analog read voltage.

According to another example embodiment, a control logic configured to control the voltage generator to supply the analog read voltage to the selected memory cells, and configured to control the analog output circuit to output the plurality of analog signals externally.

According to another example embodiment, the analog output circuit is further configured to output the plurality of analog signals without discrete processing.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
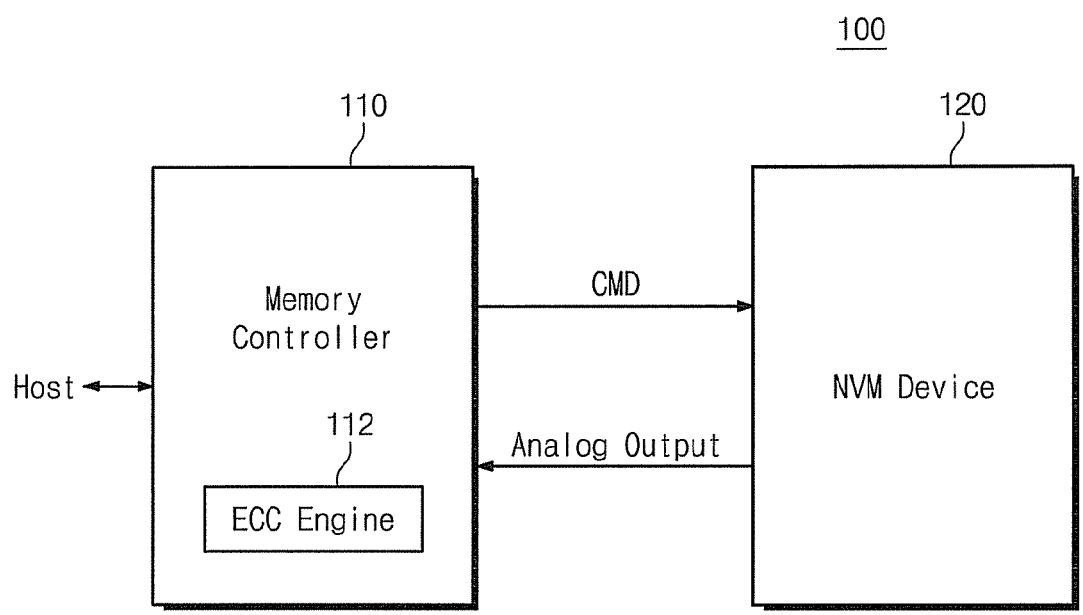
FIG. 1 shows a block diagram of a memory system according to an example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Hereinafter, flash memory device as a nonvolatile memory device will be used as one example to explain features and functions of example embodiments. But those skilled in this art will understand other features and functions to which example embodiments may be applied based on the contents of this specification. For instance, as a storage device, one of PRAM, MRAM, ReRAM, FRAM, and NOR flash memory may be used according to example embodiments. In addition, example embodiments may be applicable for a memory system that uses multiple memory devices that are different from each other as a storage device.

FIG. 1 shows a block diagram of a memory system according to an example embodiment. Referring to FIG. 1, the memory system 100 includes a memory controller 110 which includes an error correction engine ECC 112, and a nonvolatile memory device 120 like flash memory device.

The memory controller 110 accesses the nonvolatile memory device 120 in response to a request for read/write operation from a host (not shown). The memory controller 110 detects whether an error exists in data that is read from the nonvolatile memory device 120. If the memory controller 110 detects an error, the memory controller 110 performs an error correction operation and gets rid of the error in the read data. The memory controller 110 according to an example embodiment, if the number of errors in the data read from the nonvolatile memory device 120 is greater than a certain number of bits, corrects the errors in the read data using a soft decision algorithm. Generally, for an error correction by the soft decision algorithm, the memory controller 110 has to read the selected memory cell in the nonvolatile memory device 120 many times with read voltages which are denser than normal read voltages, which is called an interval read or a fine read. However, the memory controller 110 according to an example embodiment, for performing the soft decision algorithm, controls the nonvolatile memory device 120 to operate an analog read operation only once. That is, in case where the soft decision algorithm is executed, the controller 110 issues an analog read command CMD to the nonvolatile memory device 120.

In response to the analog read command CMD, the nonvolatile memory device 120 outputs read data from the selected memory cell using an analog read voltage Vard. The read data from the selected memory cell is outputted as an analog signal state Analog Output and sent to the memory controller 110. The analog read data transferred to the memory controller 110 is converted into binary data (or digital data) by operation of an analog digital converter A/D (not shown in FIG. 1) that may be included in the memory controller 110. Then, the binary data converted from the analog read data is provided to the error correction engine 112. At this time, the binary data converted from the analog read data may have the same as or more accurate resolution than read data that is acquired by using the denser read voltages which are repeatedly supplied to the nonvolatile memory device 120 during the fine read or the interval read. The error correction engine 112 corrects errors in the binary data converted from the analog read data according to the soft decision algorithm. Then the corrected data by the error correction engine 112 is transferred to the host.

The nonvolatile memory device 120 outputs read data stored in the selected memory cell under control of the memory controller 110. The nonvolatile memory device 120, in response to the analog read command CMD from the memory controller 110, provides the analog read voltage Vard to the selected memory cell. After then, an analog signal transferred through a bit line coupled to the selected memory cell is outputted as the analog output signal Analog Output, without going through a page buffer or an input/output buffer or the like. According to the analog read command CMD, the read data is outputted as an analog signal state. Accordingly, it is possible to acquire, through only a one-time analog read operation, an amount of data that is the same as or more than the amount of data acquired through the fine read or the interval read.

As a result, the nonvolatile memory device 120 in the memory system 100 in accordance with an example embodiment outputs read data in an analog signal state. The memory controller 110 converts the analog read data into binary data and uses it for performing an error correction operation. Therefore, according to an example embodiment, the number of read operations in the memory system 100 may be considerably reduced when the memory controller 110 performs an error correction operation using the soft decision algorithm, which improves the read operation speed of the memory system 100.

Figure 2:
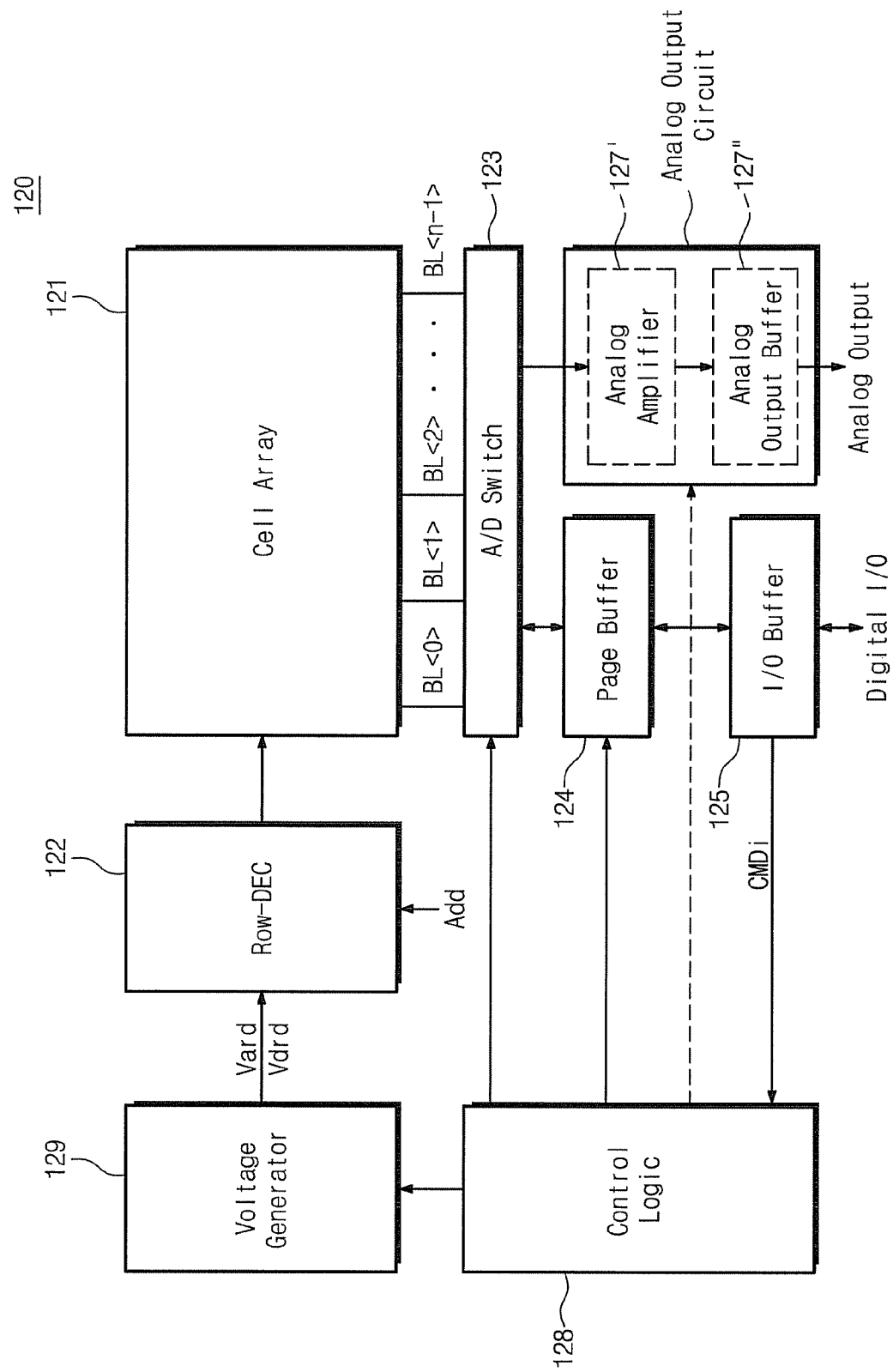
FIG. 2 is a block diagram illustrating a non-volatile memory in the memory system 100 in FIG. 1, according to an example embodiment.

FIG. 2 is a block diagram illustrating a nonvolatile memory device in the memory system 100 in FIG. 1, according to an example embodiment.

Referring to FIG. 2, the nonvolatile memory device 120 includes a memory cell array 121, a row decoder 122, an analog digital switch 123, a page buffer 124, an input/output buffer 125, an analog output circuit 126, a control logic 128 and a voltage generator 129. The nonvolatile memory device 120 has two types of read operation mode, one is a normal read operation mode using a normal read voltage Vdrd and the other is the analog read operation mode using the analog read voltage Vard. The nonvolatile memory device 120 will be explained in greater detail below.

The memory cell array 121 includes a plurality of memory cells, each of which is connected with a corresponding one of bit lines BL<0>~BL<n−1> and a corresponding one of word lines (not shown) and may store one bit data as a single level cell or multi-bit data as a multi level cell. Particularly, a multi level cell may be programmed to have one of many threshold voltage states to store multi-bit data. The multi level cell has to be able to include the number of threshold states $2k$ corresponding to the number of data bit k stored in a multi level cell within a limited threshold voltage window. Accordingly, the margin of read operation of the multi level cell becomes much smaller than that of the single level cell.

Generally, the row decoder 122 decodes row addresses and selects a word line. The row decoder 122 transfers word line voltages which are supplied from the voltage generator 129 to word lines in the memory cell array 121. For programming operation, the row decoder 122 transfers a program voltage Vpgm and a verifying voltage Vvfy to the selected word line and a pass voltage Vpass to the unselected word lines. For the normal read operation mode, the row decoder 122 transfers the normal read voltage Vdrd to the selected word line and a read voltage Vread to the unselected word lines. For the analog read operation mode, the row decoder 122 transfers the analog read voltage Vard to the selected word line and the read voltage Vread to the unselected word lines. The voltage generator 129 generates many voltages mentioned above according to a type of operation.

The A/D switch 123 connects the bit lines <0>~BL<n−1> to the page buffer 124 or the analog output circuit 126 under control of the control logic 128. In the normal read operation mode, the A/D switch 123 provides electrical signals, for example corresponding to a sensed current or sensed voltage on the bit lines, to the page buffer 124. In the analog read operation mode, the A/D switch 123 transfers electric signals, for example corresponding to a sensed current or sensed voltage on the bit lines, to the analog output circuit 126.

The page buffer 124 operates as a write driver or a sense amplifier according to the type of operation mode. For example, the page buffer 124 operates as sense amplifier for the normal read operation, and operates as write driver for a programming operation. The page buffer 124 may not operate during the analog read operation mode. The page buffer 124 for the normal read operation senses the electrical signals on the bit lines, latches the sensed data and outputs the sensed data to the I/O buffer 125.

The I/O buffer 125 receives addresses, program data and command signals from the memory controller 110 and outputs read data in digital signal state to the memory controller 110. The I/O buffer 125 sends the addresses to an address buffer (not shown), the program data to the page buffer 124 and the command signals to the control logic 128 including a command register (not shown). For the normal read operation, the I/O buffer 125 outputs read data transferred from the page buffer 124 to the memory controller 110 as a binary signal in digital signal state. The I/O buffer 125 may not operate during the analog read operation.

The analog output circuit 126 includes an analog amplifier 127' and an analog output buffer 127". The analog output circuit 126 outputs analog signals on the bit line without discrete signal processing. That is, the analog output circuit 126 can directly transfer the electrical signal (i.e., sensing current or sensing voltage), which is developed on the bit lines coupled to the selected memory cells, to an output pin. But the electrical signal developed on the bit line by sensing operation may be so small that it can be very susceptible to any noise and interference. The analog amplifier 127' amplifies the level of the electrical signal from the bit lines and transfers the amplified electrical signal to the analog output buffer 127". The analog output buffer 127" outputs the amplified electrical signal through a limited number of the output pins, for example 8, 16 or more pins.

The control logic 128 is configured to control, according to the command received through the I/O buffer 125 from the memory controller 110, the A/D switch 123, the page buffer 124, the analog output circuit 126 and the voltage generator 129 depending on what operation will be performed in the nonvolatile memory device 120, such as programming operation, reading operation or erasing operation. For the normal read operation, the control logic 128 controls the A/D switch 123 so that the bit lines are connected to the page buffer 124 electrically and controls the voltage generator 129 to generate the normal read voltage Vdrd and send it to the selected word line. Also the control logic 128 controls the page buffer 124 to sense the signal on the bit line, latch the sensed signal and output the sensed signal to the I/O buffer 125 as digital signal. In contrast, for the analog read operation, the control logic 128 controls the A/D switch 123 so that the bit lines are connected to the analog output circuit 126 electrically and controls the voltage generator 129 to generate the analog read voltage Vard and send it to the selected word line. Additionally, the control logic 128 controls the analog output circuit 126 to output the signal on the bit line as the analog output.

The voltage generator 129 generates various voltages under control of the control logic 128. The voltage generator 129 generates the Normal read voltage Vdrd or the analog read voltage Vard that is supplied to the selected word line under control of the control logic 128. That is, for the normal read operation, the voltage generator 129 generates the read voltage Vread and the normal read voltage Vdrd and transfers them to the Row decoder 122. For the analog read operation, the voltage generator 129 generates the read voltage Vread and the analog read voltage Vard, and transfers them to the Row decoder 122.

As described above, the nonvolatile memory device 120 according to an example embodiment can output data as a binary digital signal or an analog signal according to read operation mode.

Figure 3:
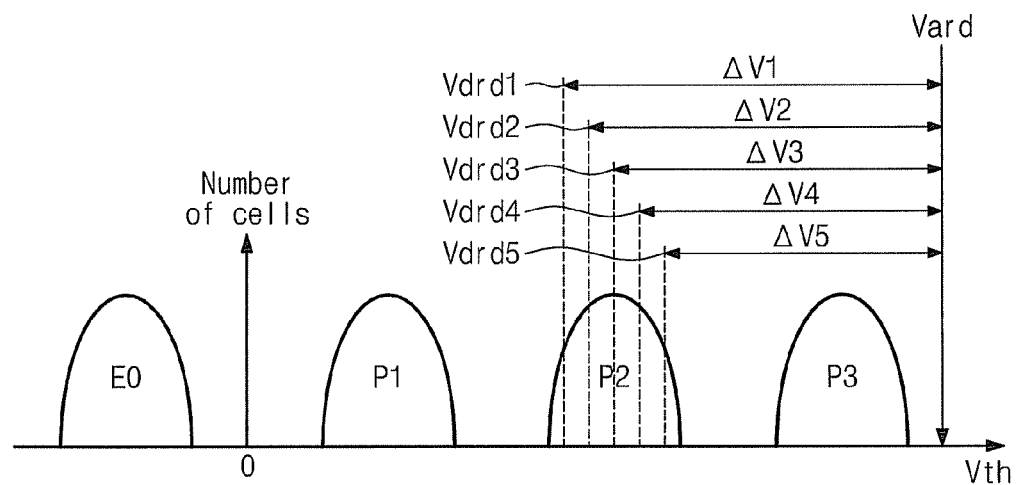
FIG. 3 is a graph to explain an analog read operation according to an example embodiment.

FIG. 3 is a threshold voltage distribution graph to explain the analog read operation according to an example embodiment. Referring to FIG. 3, the selected word line during the analog read operation is supplied one time with the analog read voltage Vard. At this time, the electrical signals developed on the bit lines coupled to the selected memory cells are transferred to the analog output circuit 126 without discrete signal processing.

When an error is detected and a soft decision algorithm for increasing the number of correctable bits is used, data may be read with voltages having a smaller interval rather than read voltages corresponding to voltages between program states (e.g., E0, P1, P2, P3). That is, for reading program state P2, read operations for each of read voltages Vdrd1, Vdrd2, Vdrd3, Vdrd4 may be used. Such read operations are called fine read, fractional read or interval read. To increase the number of correctable bits, it may be necessary to perform a fine read operation for all program states P1~P3. Fine read operations lead to a rapidly increasing number of read operations and a decreased speed of the read operation.

The analog read operation according to example embodiments may obtain all information which can be obtained by the fine read operation using a one-time read operation for the selected memory cell. Details will be described with reference to accompanying drawings below.

Once the analog read command is provided from the memory controller 110, the voltage generator 129 generates the analog read voltage Vard. Then the analog read voltage Vard is transferred to the selected word line through the row decoder 122. At this time, the electrical signal of sensing current or sensing voltage on each of bit lines coupled to the selected memory cells is generated according to magnitude of threshold voltage of the selected memory cells. For example, among the programmed memory cells having a program state P2, more current flows through a memory cell programmed to have threshold voltage less than read voltage Vdrd1 of program state P2 than in a memory cell programmed to have threshold voltage greater than read voltage Vdrd5 of program state P2. Also, among the programmed memory cells having a program state P2, more current flows through a memory cell programmed to have threshold voltage less than read voltage Vdrd1 of program state P2 than in a memory cell programmed to have threshold voltage greater than read voltage Vdrd1 of program state P2. Outputting the electrical signal of sensing current or sensing voltage that depends on the magnitude of threshold voltage of the memory cell, without discrete signal processing, allows for reading the same amount of information with a one-time read operation that can be read by many fine read operations.

That is, each selected memory cell may generate an electrical signal on each bit line, and each electric signal may correspond to a difference between a magnitude of threshold voltage and the analog read voltage Vard. Memory cells programmed to have threshold voltage of the Vdrd1, among the memory cells programmed to have program state P2, have $\Delta V1$ voltage difference from the analog read voltage Vard. Memory cells programmed to have threshold voltage of the Vdrd4, among the memory cells programmed to be program state P2, have $\Delta V4$ voltage difference from the analog read voltage Vard. Memory cells having a threshold voltage that is significantly different from the analog read voltage Vard generate bigger electrical signals on the bit line.

The analog read voltage Vard may be the same as or similar to the read voltage Vread that is supplied to an unselected word line during the read operation. However, the level of the analog read voltage Vard is not limited to this example.

The memory controller 110 receives the electrical signal from the nonvolatile memory device 120 as a result of the analog read operation and performs quantization on the received electrical signal with great resolution, so that it can be used as fine read data to operate the soft decision algorithm.

Figure 4:
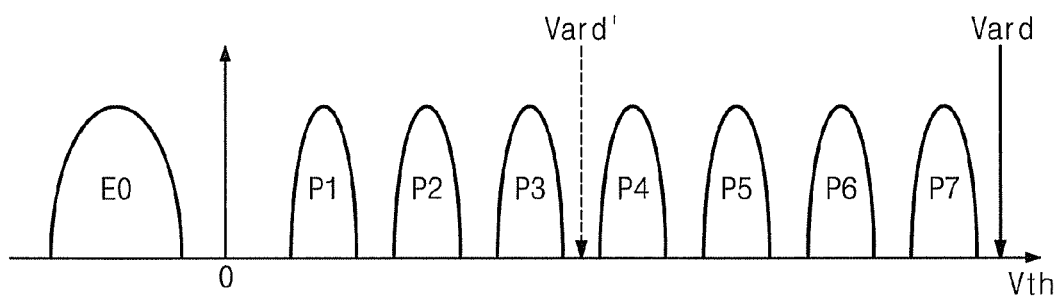
FIG. 4 is a graph to explain an analog read operation according to another example embodiment.

FIG. 4 is a graph to explain the analog read operation according to another example embodiment. Referring to FIG. 4, 8 program states E0, P1~P7 are shown for 3-multi bit memory cell. In contrast to the example of FIG. 3, two analog read voltages Vard, Vard' are shown in FIG. 4. The analog read voltage Vard in FIG. 3 is supplied to be greater than the voltages of all program states P1~P3. But the analog read voltage Vard is not limited here. In FIG. 4, the analog read voltage may be Vard that is greater than voltages of all program states P1~P7 or be Vard' that is in between voltages of program sates P1~P7. That is, the analog read voltage Vard' may be set to be in between program state P3 and program state P4. Also the analog read voltage Vard may be less than that of program states P1~P7. The level of the analog read voltage Vard is not limited to thereto.

Figure 5:
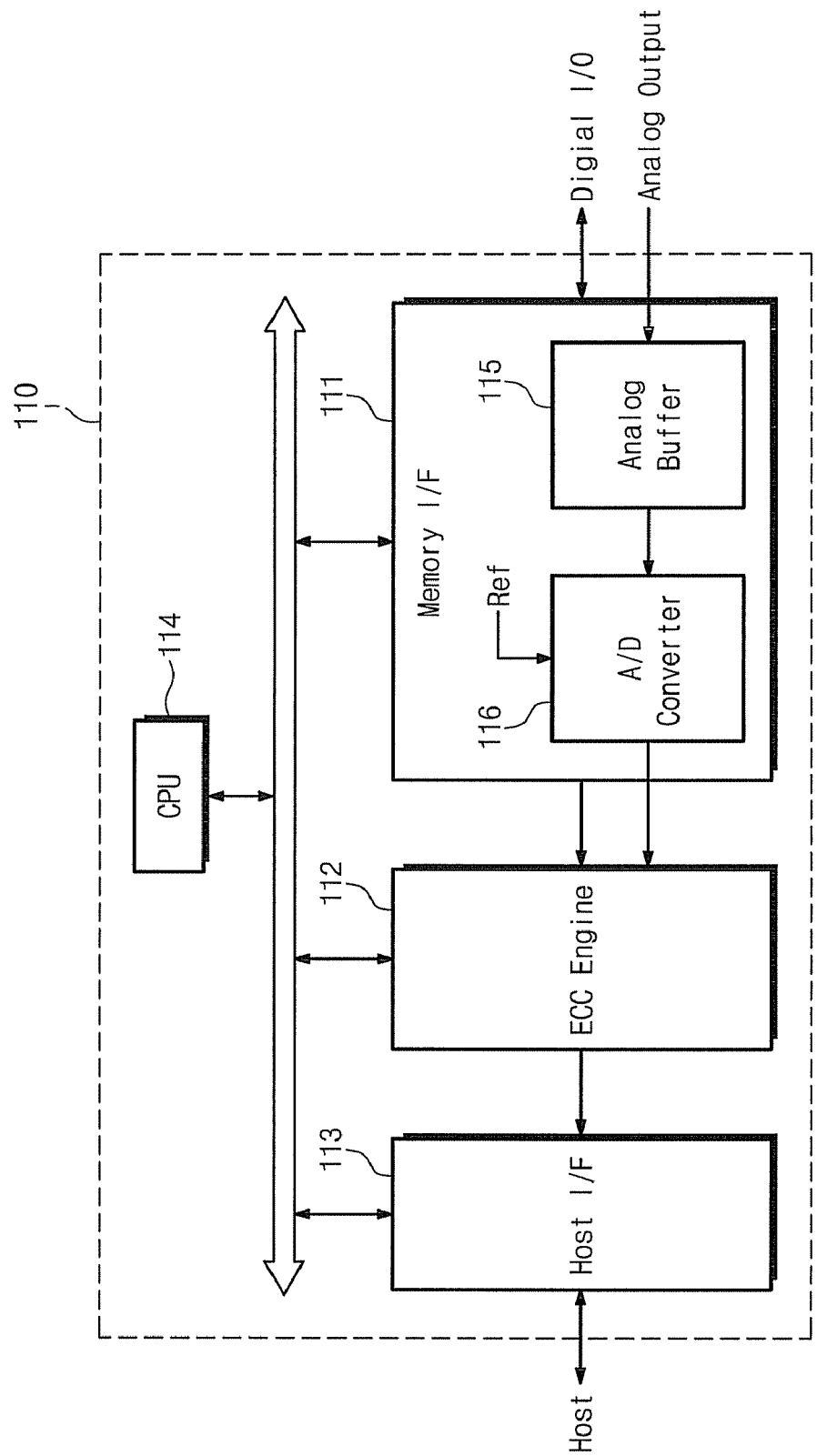
FIG. 5 is block diagram showing a memory controller in FIG. 1 according to an example embodiment.

FIG. 5 is block diagram showing a memory controller in FIG. 1 according to an example embodiment. Referring to FIG. 5, the memory controller 110 includes a memory interface 111, an ECC engine 112, a host interface 113 and a CPU 114.

The host interface 111 converts the analog output from the nonvolatile memory device 120 into a digital signal. The host interface 111 includes an analog buffer 115 to receive the analog output, and an A/D converter 116 to convert the received analog output into the digital data. The analog output that is inputted to the analog buffer 115 is converted into binary data or discrete signal by the A/D converter 116. The A/D converter 116 can convert the buffered analog output into binary data having the same resolution as that of the fine read operation so that the A/D converter 116 controls the degree of quantization error. Alternatively, the A/D converter 116 converts the buffered analog output into binary data with high resolution to increase accuracy of the soft decision algorithm, so that the A/D converter 116 controls a reference to have low quantization error. According to adjusting the reference, the A/D converter 116 can generate binary data having the same as or more resolution than that of the fine read operation.

The binary data converted from the analog output by quantization process in the host interface 111 is provided to the ECC engine 112. As the nonvolatile memory device 120 is scaled down more, the ability to correct more error bits may be desirable. Also, as more and more bits are stored per memory cell, the possibility an error occurring increases. As a result, it may be desirable for the ECC engine 112 to have an ability to correct more error bits. An example of a high performance ECC engine that is used for the ECC engine 122 includes a Turbo ECC or Low-density parity check LPRC code. These error correction codes are known for having an error correction ability that theoretically is close to Shannon limit. Also, these high performance error correction codes may correct errors using the soft decision algorithm and increase the reliability of the corrected data.

The soft decision algorithm may be more complex and may take more time than a hard decision algorithm which decides bit value using only inputted data. For the soft decision algorithm, data which relates to data for deciding bit value is needed additionally. The fine read operation can provide the additional data but needs many read operations in the nonvolatile memory device 120 using read voltages with a narrow interval of threshold voltage.

The corrected data with no error bit is transferred by the ECC engine 112 to the host interface 113 and then to the host (not shown). The CPU 114 is configured to control each element in order to operate overall operation of the memory controller 110 according to a predetermined procedure. Though not shown, the memory controller 110 further includes, for example, a SRAM as a working memory for the CPU 114. Moreover, it is apparent to those skilled in the art that the memory controller 110 may further include a ROM to store a code data for interfacing with the host.

As described above, the memory controller 110 according to an example embodiment provides the analog read command for the nonvolatile memory device 120 when error correction operation using the soft decision algorithm is needed. Then the memory controller 110 receives the analog output from the nonvolatile memory device 120 as a result of the analog read operation, converts the analog output into binary data, and corrects errors using the soft decision algorithm. That is, data required for the soft decision algorithm is acquired through a one-time analog read operation. Accordingly, the memory controller 110 and the nonvolatile memory device 120 according to an example embodiment reduces the burden of high performance error correction operation and considerably increase the speed of read operation.

Figure 6:
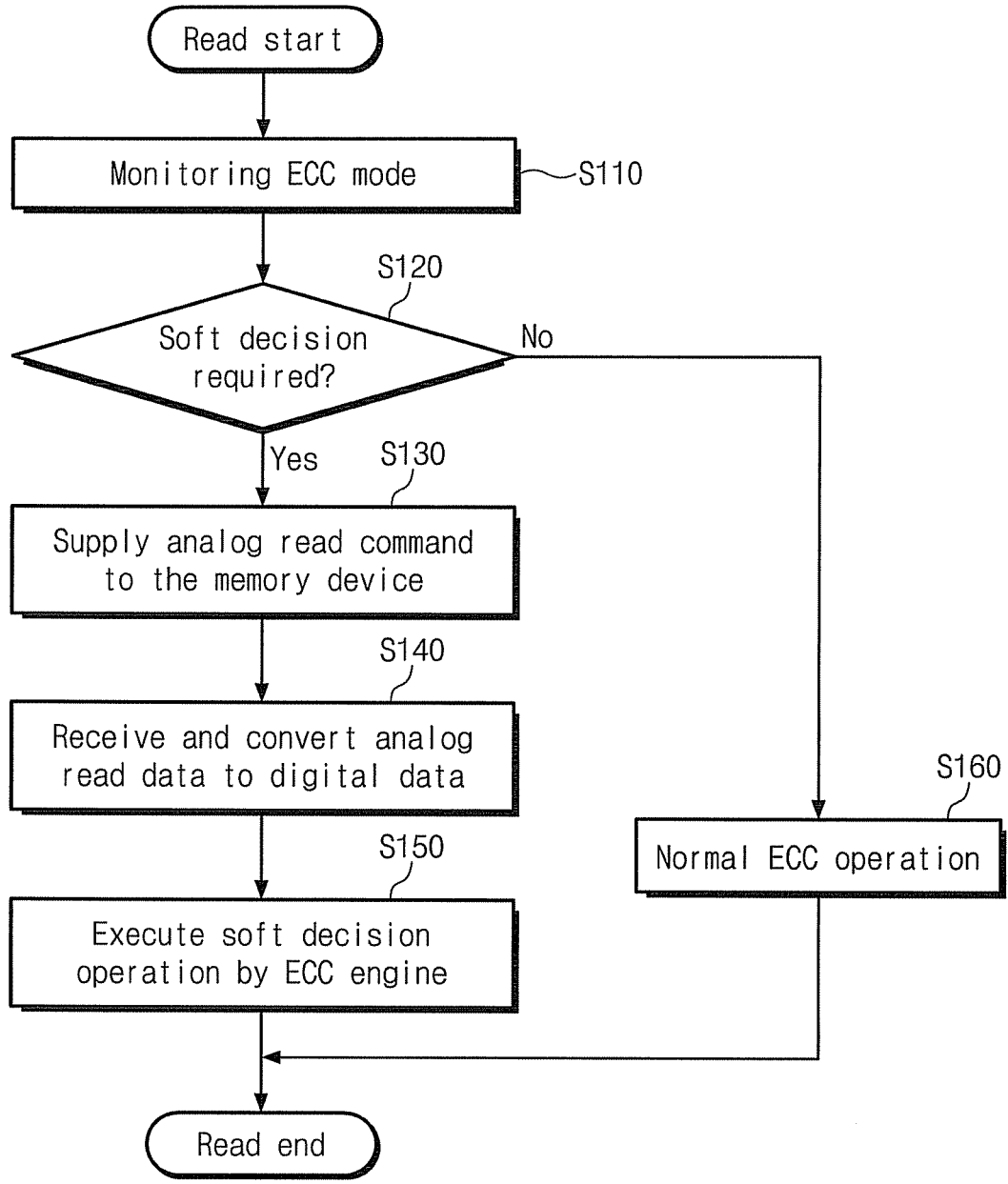
FIG. 6 is a flowchart showing a control operation of the memory controller of FIG. 5 according to an example embodiment.

FIG. 6 is a flowchart showing a control operation of the memory controller of FIG. 5 according to an example embodiment. Operation of the nonvolatile memory device 120 under control of the memory controller 110 and operation of the soft decision algorithm that is subsequent to operation of the nonvolatile memory device 120 will be explained with reference to FIG. 6.

The memory controller 110 continues to monitor ECC mode. For example, a case that needs a high performance error correction operation may happen depending on the result of error detecting on the data transferred from the nonvolatile memory device 120. Thus, according to the result of error detecting on the data transferred from the nonvolatile memory device 120, it may be judged impossible to correct detected error on the data by the hard decision algorithm. For this case, to correct detected error, additional read operation like the fine read operation has to be processed. In step S110, the memory controller 110 monitors occurrence of this situation. That is to say, the memory controller 110 detects whether the soft decision algorithm is needed or not for error correction operation in step S120.

In step S120, the memory controller 110 determines whether the soft decision algorithm is needed or not. In step S120, if the soft decision algorithm is not needed, the memory controller 110 proceeds to step S160 and corrects error in the read data using the general error correction algorithm, i.e., hard decision algorithm. Alternatively, if the soft decision algorithm is judged to be needed, the memory controller 110 proceeds to step 130 for the analog read operation. In step S130, the memory controller 110 supplies the analog read command to the nonvolatile memory device 120. The nonvolatile memory device 120 may have a new memory register to receive the analog read command and control logic to control procedures. In response to the analog read command, the nonvolatile memory device 120 senses the electric signal on bit lines coupled to the selected memory cells and sends the analog output to the memory controller 110. In step S140, the memory controller 110 receives the analog data and converts it into digital data. In step S150, the ECC engine 112 executes the soft decision algorithm on the digital data converted from the analog output Accordingly, error that can not be corrected by the hard decision algorithm is corrected by the soft decision algorithm and then read data with no error is transferred to the host and the read operation is finished.

As explained above, control operation for error correction by the memory controller 110 according to an example embodiment was simply explained. However, the method of FIG. 6 is only an example. The analog read operation according to example embodiments can be applicable for various purposes as well as the error correction operation.

Figure 7:
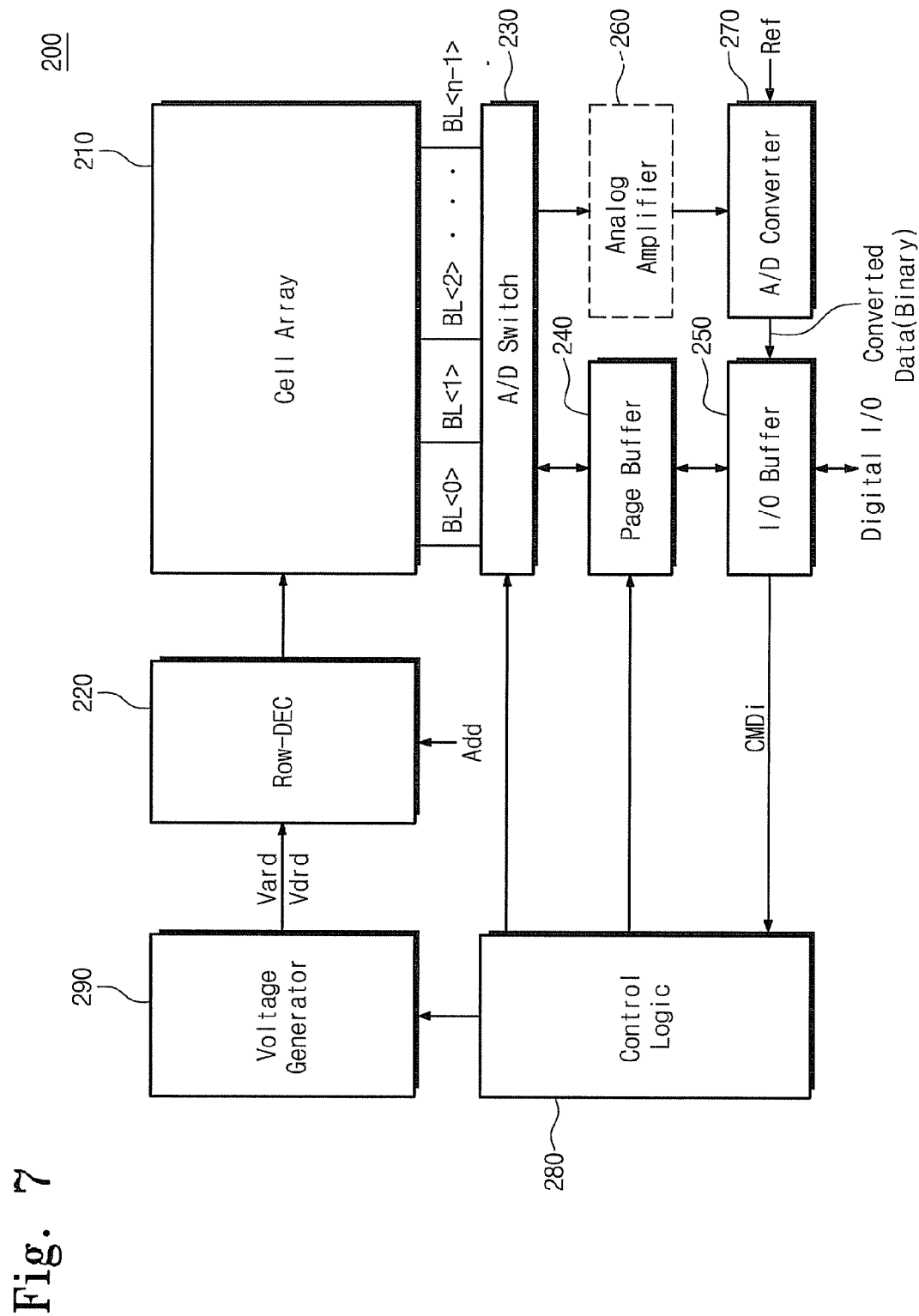
FIG. 7 is a block diagram of a nonvolatile memory device according to another example embodiment.

FIG. 7 is a block diagram of a nonvolatile memory device according to another example embodiment. Referring to FIG. 7, the nonvolatile memory device 200 has two types of read operation mode like the nonvolatile memory device 120 of FIG. 2. That is, the nonvolatile memory device 200 can selectively execute one of the normal read mode using the normal read voltage Vdrd and the analog read mode using the analog read voltage Vard. But the nonvolatile memory device 200 outputs digital data signal rather than the analog output as a result of the analog read mode. Details will be explained below.

A memory cell array 210, a row decoder 220, an A/D switch 230, a page buffer 240, an I/O buffer 250, a control logic 280 and a voltage generator 290 are substantially the same as those of the 120. Accordingly explanation of these elements is omitted. The nonvolatile memory device 200 includes an analog amplifier 260 and an A/D converter 270 to output digital data as a result of the analog read operation. The analog amplifier 260 amplifies the electric signal (sensing current or sensing voltage) on bit lines BL<0>~BL<n−1> associated with the selected memory cells during read operation. The electric signal (sensing current or sensing voltage) on bit lines BL<0>~BL<n−1> is so weak that it is susceptible to noise and interference. Accordingly, using the analog amplifier 260 that amplifies the level of the electric signal on bit lines BL<0>~BL<n−1> may improve reliability.

The amplified analog signal outputted from the analog amplifier 260 is converted into digital data by the A/D converter 270. The A/D converter 270 quantizes the amplified analog data outputted from the analog amplifier 260. The A/D converter 270 may be provided a reference to control the magnitude of quantization error. The A/D converter 270 can convert the analog data into binary data with various resolutions according to the control of the reference. The converted binary data is outputted to the host through the I/O buffer 250. Also, the binary data converted by the A/D converter 270 may be outputted to the host through an additional output buffer (not illustrated) that is different than the I/O buffer 250.

The nonvolatile memory device 200 according to another example embodiment discussed above with reference to FIG. 7 converts analog signal generated in response to the analog read command into binary data internally and outputs the binary data to the memory controller 110. Accordingly, the burden of converting analog into digital in the memory controller 110 that operates the soft decision algorithm can be reduced. Also, though the nonvolatile memory device 200 is pictured as including the analog amplifier 260, the nonvolatile memory device 200 may not include the analog amplifier 260.

Figure 8:
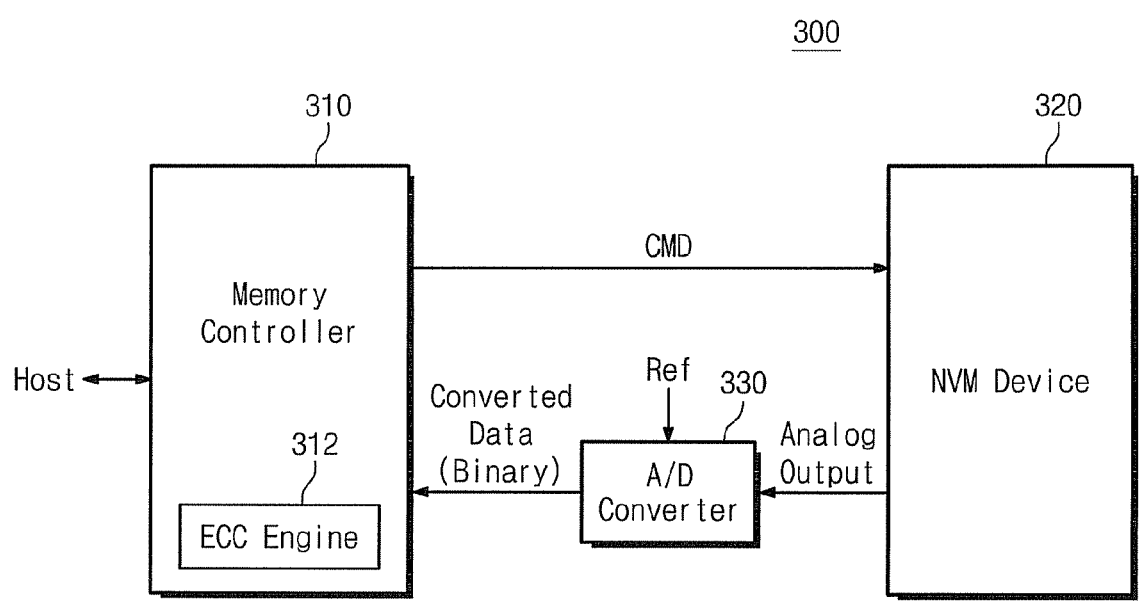
FIG. 8 shows a memory system according to another example embodiment.

FIG. 8 shows a memory system according to another example embodiment. Referring to FIG. 8, the memory system 300 includes a memory controller 310 having an ECC engine 312 and a nonvolatile memory device 320. The memory controller 310 accesses the nonvolatile memory device 320 in response to read/write request from a host. The memory controller 310 detects whether an error exists in read data from the nonvolatile memory device 320. If an error is detected, the memory controller 310 executes error correction operation and gets rid of the error. Furthermore, when the error bits in the read data exceeds a certain number of bits, the memory controller 310 corrects the error in the read data using the soft decision algorithm. The memory controller 310 according to the example controls the nonvolatile memory device 320 to perform a one-time analog read operation for the soft decision algorithm. That is to say, the memory controller 310 issues the analog read command to the nonvolatile memory device 320 when the soft decision algorithm is needs to be performed.

The nonvolatile memory device 320, in response to the analog read command, begins to read data from the selected memory cell using the analog read voltage Vard, and outputs data as an analog output to an A/D converter 330. The A/D converter 330 is between the nonvolatile memory device 320 and the memory controller 310 and converts the analog data into binary data. The ECC engine 312 in the memory controller 310 receives the converted binary data from the A/D converter 330. At this time, the analog output to be converted binary data may have an amount of information that is the same as or more than an amount of information in data read with narrow read voltages in the fine read operation. The ECC engine 312 corrects errors in the converted binary data using the soft decision algorithm. Then the memory controller 310 sends the corrected binary data to the host.

The nonvolatile memory device 320 reads data from the selected memory cell according to control of the memory controller 310. The nonvolatile memory device 320 reads data from the selected memory cell using a read voltage that is indicated by the memory controller 310 through one of read operation mode. Particularly, the nonvolatile memory device 320 supplies the analog read voltage to the selected memory cell in response to the analog read command. Then the nonvolatile memory device 320 outputs the electric signal on bit lines as the analog output without going through the page buffer and input/output buffer or the like. The nonvolatile memory device 320 may have a construction that is the same as or similar to the construction of the nonvolatile memory device 120 illustrated in FIG. 2.

Also, in the memory system 300 according to the example, the A/D converter 330 may be added outside of the nonvolatile memory device 320 and the memory controller 310, so that the A/D converter 330 can reduce the burden of the memory controller 310 and the nonvolatile memory device 320.

Figure 9:
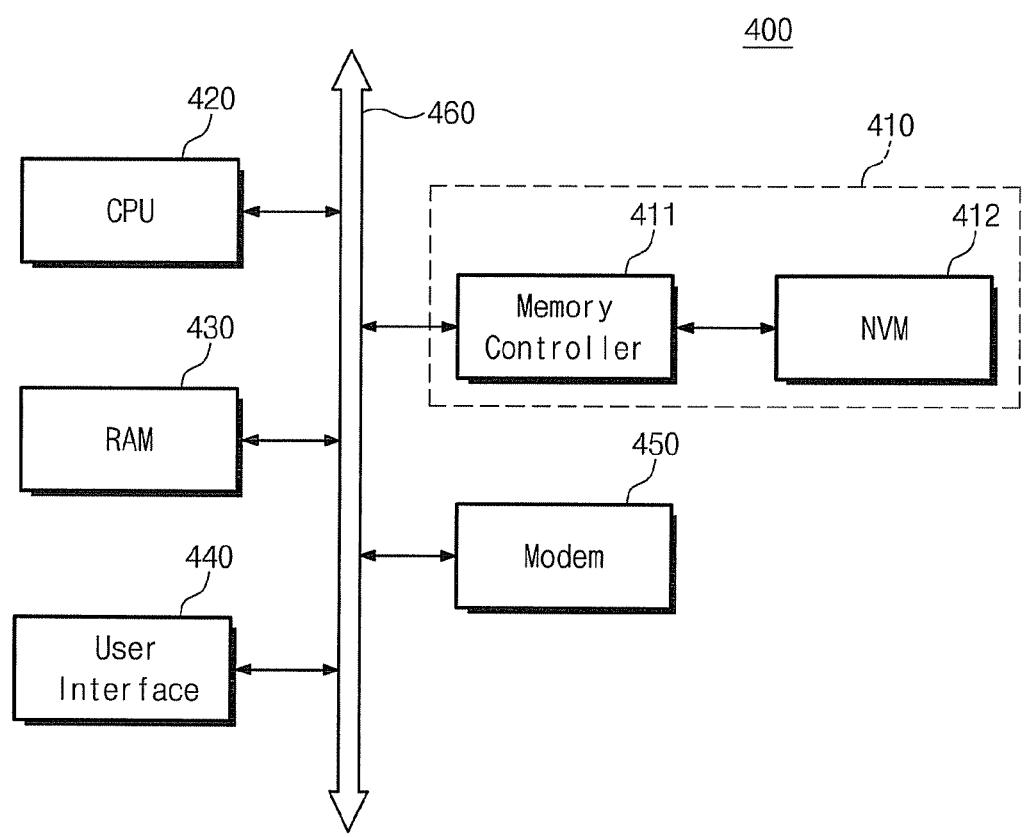
FIG. 9 shows a computing system including a memory system in accordance with an example embodiment.

FIG. 9 shows a computing system including a memory system 410 in accordance with an example embodiment. Referring to FIG. 9, the computing system 400 includes a CPU 420, a RAM 430, a user interface 440, a modem 450 like a baseband chipset, and a memory system 410, all of which are connected to a system bus 460. The memory system 410 including a memory controller 411 and a nonvolatile memory device 412 may have a construction that is the same as or similar to the construction shown in FIG. 1 or FIG. 8.

If the computing system 400 according to an example embodiment is a mobile device, a battery for providing an operating voltage for the computing system 400 may be included in the computing system. Though not shown in FIG. 9, it will be apparent to those skilled in the art that the computing system 400 may further include an application chipset, a camera image processor CIS, a mobile DRAM or the like. The memory system 410 may includes a SSD (Solid State Drive/Disk) or fusion flash memory like one-NAND flash memory, each of which has an analog read operation mode.

The computing system 400 including the memory system 410 according to an example embodiment may improve read performance by using the soft decision algorithm in response to an analog read operation.

The memory controller 411 and the nonvolatile memory device 412 may be mounted in various ways of packages, such as, Package on Package (PoP), Ball Grid Array (BGA), Chip Scale Package (CSPs), Plastic Leaded Chip Carrier (PLCC), Plastic Dual In-Line Package (PDIP), Die in Waffle Pack, Die in Wafer Form, Chip on Board (COB), Ceramic Dual In-Line Package (CERDIP), Plastic Metric Quad Flat Pack (MQFP), Thin Quad Flat Package (TQFP), Small Outline IC (SOIC), Shrink Small Outline Package (SSOP), Thin Small Outline Package (TSOP), Thin Quad Flat Package (TQFP), System In Package (SIP), Multi Chip Package (MCP), Wafer-level Fabricated Package (WFP), Wafer-level Processed Stack Package (WSP).

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A memory system comprising:
   a memory device including a plurality of memory cells, the memory device being configured to output a plurality of analog signals from selected memory cells of the plurality of memory cells during a read operation;
   a converter configured to convert the plurality of analog signal into binary data; and
   a memory controller configured to perform an error correction operation on the binary data,
   wherein the converter is configured to receive a reference signal and convert the plurality of analog signals into the binary data based on the reference signal, a resolution of the binary data being determined by the reference signal.

2. The memory system of claim 1, wherein the memory controller is configured to supply an analog read command to the memory device, and the read operation is performed based on the analog read command.

3. The memory system of claim 1, wherein the plurality of analog signals each have a voltage level and each voltage level of the plurality of analog signals is based on a threshold voltage of each of the selected memory cells.

4. The memory system of claim 1, wherein the converter is included in at least one of the memory device and the memory controller.

5. The memory system of claim 1, wherein the error correction operation is a soft decision operation performed using the binary data.

6. The memory system of claim 1, wherein the memory device further includes
   a memory cell array including the plurality of memory cells, the plurality of memory cells being nonvolatile memory cells;
   a page buffer configured to sense and latch data of the plurality of nonvolatile memory cells through a plurality of bit lines;
   an analog output circuit configured to output the plurality of analog signals that are detected from the plurality of bit lines during the read operation;
   a switch configured to selectively connect the plurality of bit lines to the page buffer or the analog output circuit; and
   a control logic configured to control the switch to output the plurality of analog signals, in response to a command from the memory controller.

7. The memory system of claim 6, wherein the analog output circuit includes an analog amplifier configured to amplify the plurality of analog signals and an analog output buffer configured to output the amplified plurality of analog signals.

8. The memory system of claim 6, wherein the analog output circuit is further configured to output the plurality of analog signals without discrete processing.

9. A nonvolatile memory device, comprising:
   a memory cell array including a plurality of memory cells;
   an analog output circuit configured to output a plurality of analog signals detected on bit lines coupled to selected memory cells from among the plurality of memory cells during a read operation;
   a voltage generator configured to generate an analog read voltage for the read operation; and
   a control logic configured to control the voltage generator to supply the analog read voltage to the selected memory cells, and configured to control the analog output circuit to output the plurality of analog signals externally,
   wherein the nonvolatile memory device further includes a converter configured to receive a reference signal and to convert the plurality of analog signals to binary data based on the reference signal, a resolution of the binary data being determined by the reference signal.

10. The nonvolatile memory device of claim 9, wherein the analog output circuit is configured to output the plurality of analog signals to the converter, and the converter is configured to convert the plurality of analog signals to binary data and output the binary data externally.

11. The nonvolatile memory device of claim 10, wherein the analog output circuit is further configured to output the plurality of analog signals without discrete processing.

12. A nonvolatile memory device, comprising:
   a memory cell array including a plurality of memory cells;
   a voltage generator configured to generate an analog read voltage;
   an analog output circuit configured to output a plurality of analog signals detected on bit lines coupled to selected memory cells from among the plurality of memory cells during a read operation, each of the plurality of analog signals being based on the analog read voltage and a threshold voltage of each corresponding memory cell of the selected memory cells; and
   a converter configured to convert the plurality of analog signals to binary data by performing a comparison based on each of the plurality of analog signals and the analog read voltage.

13. The nonvolatile memory device of claim 12, wherein the converter is configured to convert the plurality of analog signals to binary data based on a difference between each of the plurality of analog signals and the analog read voltage.

14. The nonvolatile memory device of claim 12, further comprising:
   a control logic configured to control the voltage generator to supply the analog read voltage to the selected memory cells, and configured to control the analog output circuit to output the plurality of analog signals externally.

15. The nonvolatile memory device of claim 12, wherein the analog output circuit is further configured to output the plurality of analog signals without discrete processing.

* * * * *